(12) United States Patent
Teng

(10) Patent No.: US 12,243,804 B1
(45) Date of Patent: Mar. 4, 2025

(54) COOLING HEATSHIELD FOR CLAMSHELL BGA REWORK

(71) Applicant: Google LLC, Mountain View, CA (US)

(72) Inventor: Sue Yun Teng, Belmont, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/239,361

(22) Filed: Aug. 29, 2023

Related U.S. Application Data

(63) Continuation of application No. 17/202,552, filed on Mar. 16, 2021, now Pat. No. 11,791,239.

(51) Int. Cl.
*H01L 23/467* (2006.01)
*H01L 23/498* (2006.01)

(52) U.S. Cl.
CPC ...... *H01L 23/467* (2013.01); *H01L 23/49816* (2013.01)

(58) Field of Classification Search
CPC .......... H01L 23/467; H01L 23/49816; H01L 2924/15311
See application file for complete search history.

(56) References Cited

U.S. PATENT DOCUMENTS

| | | | |
|---|---|---|---|
| 6,347,734 B1 | 2/2002 | Downes | |
| 6,533,577 B2 | 3/2003 | Anderson et al. | |
| 6,933,598 B2 | 8/2005 | Karnezos | |
| 10,126,356 B2 | 11/2018 | Barabi et al. | |
| 10,154,612 B1 | 12/2018 | Sun et al. | |
| 2004/0188829 A1* | 9/2004 | Hu | H01L 23/36 257/E23.101 |
| 2005/0151555 A1* | 7/2005 | Lewis | F25B 9/145 361/676 |
| 2005/0273208 A1 | 12/2005 | Yazawa et al. | |
| 2007/0103868 A1 | 5/2007 | Yazawa | |
| 2009/0289100 A1 | 11/2009 | Ishikawa et al. | |
| 2012/0008284 A1 | 1/2012 | Liu et al. | |
| 2014/0077349 A1 | 3/2014 | Higgins, III | |
| 2020/0411407 A1 | 12/2020 | Dubey et al. | |
| 2022/0117112 A1* | 4/2022 | Subrahmanyam | H01L 23/3677 |

OTHER PUBLICATIONS

Flip Chip Ball Grid Array Package Reference Guide, Texas Instruments, Literature No. SPRU811A, May 2005, 72 pages.

Extended European Search Report for European Patent Application No. 21182875.1 dated Jan. 26, 2022. 7 pages.

* cited by examiner

*Primary Examiner* — Adam B Dravininkas
(74) *Attorney, Agent, or Firm* — Lerner David LLP

(57) ABSTRACT

The present disclosure provides for a heatshield that can be actively cooled during a rework process. The heatshield may include a backer plate and a metal plate. A plurality of vents may extend from air inlet ducts to a top surface of the backer plate such that the plurality of vents directs cooling gas forced into the heatshield towards the metal plate and a first ball grid array (BGA) package. The cooling gas may maintain the solder joint temperature of the first BGA package below a reflow temperature and below a solidus temperature to prevent reflow-related solder joint defects from occurring in the first BGA package during rework of a second BGA package.

20 Claims, 5 Drawing Sheets

COOLING HEATSHIELD FOR CLAMSHELL BGA REWORK

CROSS-REFERENCE TO RELATED APPLICATIONS

This application is a continuation of U.S. application Ser. No. 17/202,552, filed on Mar. 16, 2021, the disclosure of which is incorporated herein by reference.

BACKGROUND

Ball grid array ("BGA") packages may be used on both sides of a printed circuit board ("PCB") as PCB designs become more complex and functionally dense. As BGA packages increase in body size and complexity, the propensity for solder joint defects during assembly increases. Solder joint defects may result in rework of the solder joints to be performed during manufacturing. For a clamshell BGA configuration, if either of the top-side or bottom-side BGAs requires rework, the opposite-side BGA may be subjected to a reflow excursion. This may introduce solder joint defects for some BGA designs that include Via-in-Pad-Plated-Over ("VIPPO") and non-VIPPO, or deep backdrilled BGA pads. Alternatively, warpage-related solder joint defects, such as bridging, head-in-pillow, etc., may occur for the bottom-side BGA due to increased temperature variations within the package and solder joints during rework as compared with the surface mount reflow process.

BRIEF SUMMARY

The present disclosure provides a heatshield with active cooling capability to a first ball grid array ("BGA") package during rework of a second BGA package of a clamshell BGA. The first BGA package may be the bottom-side BGA package and the second BGA package may be the top-side BGA package. The first and second BGA packages may be located on opposite sides of a printed circuit board ("PCB"), creating a clamshell BGA structure. The first BGA package may be on the side of the PCB board that faces the heatshield. The heatshield may include a backer plate and a metal plate. In some examples, the heatshield may also include a package pedestal. The backer plate may include one or more air inlet ports that are configured to be coupled to an air compressor. Air inlet ducting may extend from the air inlet ports through at least a portion of the backer plate. One or more vents may extend from the air inlet ducting to a top surface of the backer plate. The air inlet ducting and one or more vents may direct cooling gas towards the metal plate. The metal plate may be a finned metal plate. The heatshield may absorb thermal energy, or heat, during rework of the second BGA package.

To cool the first BGA package during the rework of the second BGA package and, therefore, to prevent hot tears, separation, joint failure, defects, etc. of the solder joints of the first BGA package, cooling gas may be forced into the heatshield via the air inlet port and/or air inlet ducting. The cooling gas may be directed towards the metal plate and the first BGA package, rather than directly towards the solder joint area. By directing the cooling gas towards the metal plate and the first BGA package instead of the solder joint area, the PCB and second BGA may maintain the heat necessary to allow rework to occur. The active cooling of the heatshield using cooling gas may maintain the solder joint temperature of the first BGA package below the reflow temperature and below the solidus temperature of the solder joints.

On aspect of the disclosure includes a system, comprising a backer plate including at least one air inlet port and a metal plate coupled to the backer plate. The metal plate and the backer plate may form one or more outlets. The at least one air inlet port may be configured to receive cooling gas to decrease a temperature of at least one of the metal plate and the backer plate. The cooling gas may be configured to exit the system through at least one of the one or more outlets.

The backer plate may further include air inlet ducting connected to the at least one air inlet port, and a first plurality of vents extending from the air inlet ducting to a first surface of the backer plate.

The system may further comprise a printed circuit board ("PCB") and a first ball grid array ("BGA") package positioned between the metal plate and the PCB, wherein the first BGA is coupled to a bottom surface of the PCB. The system may further comprise a second BGA package soldered to a top surface of the PCB. At least one of the backer plate or the metal plate may be configured to absorb heat from the first BGA package during rework of a second BGA package.

The metal plate may be a finned metal plate. The cooling gas may be configured to exit the system through at least one fin of the finned metal plate.

The system may further comprise a package pedestal coupled to the backer plate. The package pedestal may be positioned between the backer plate and the metal plate. The one or more outlets formed by the metal plate and the backer plate may extend along a top surface of the package pedestal. The one or more outlets may include a recess in the package pedestal extending from a center of the package pedestal to a perimeter edge of the package pedestal. The backer plate may further include air inlet ducting connected to the at least one air inlet port, and a first plurality of vents extending from the air inlet ducting to a first surface of the backer plate. The package pedestal may include a second plurality of vents extending from a bottom surface of the package pedestal to a top surface of the package pedestal, and the second plurality of vents may align with the first plurality of vents when the package pedestal is coupled to the backer plate.

Another aspect of disclosure includes a heatshield comprising a backer plate including at least one air inlet port and air inlet duct connected to the at least one air inlet port, a package pedestal coupled to the backer plate, and a metal plate coupled to the package pedestal. The at least one air inlet port and the air inlet duct may be configured to receive cooling gas to decrease a temperature of the metal plate.

DETAILED DESCRIPTION

Figure 1:
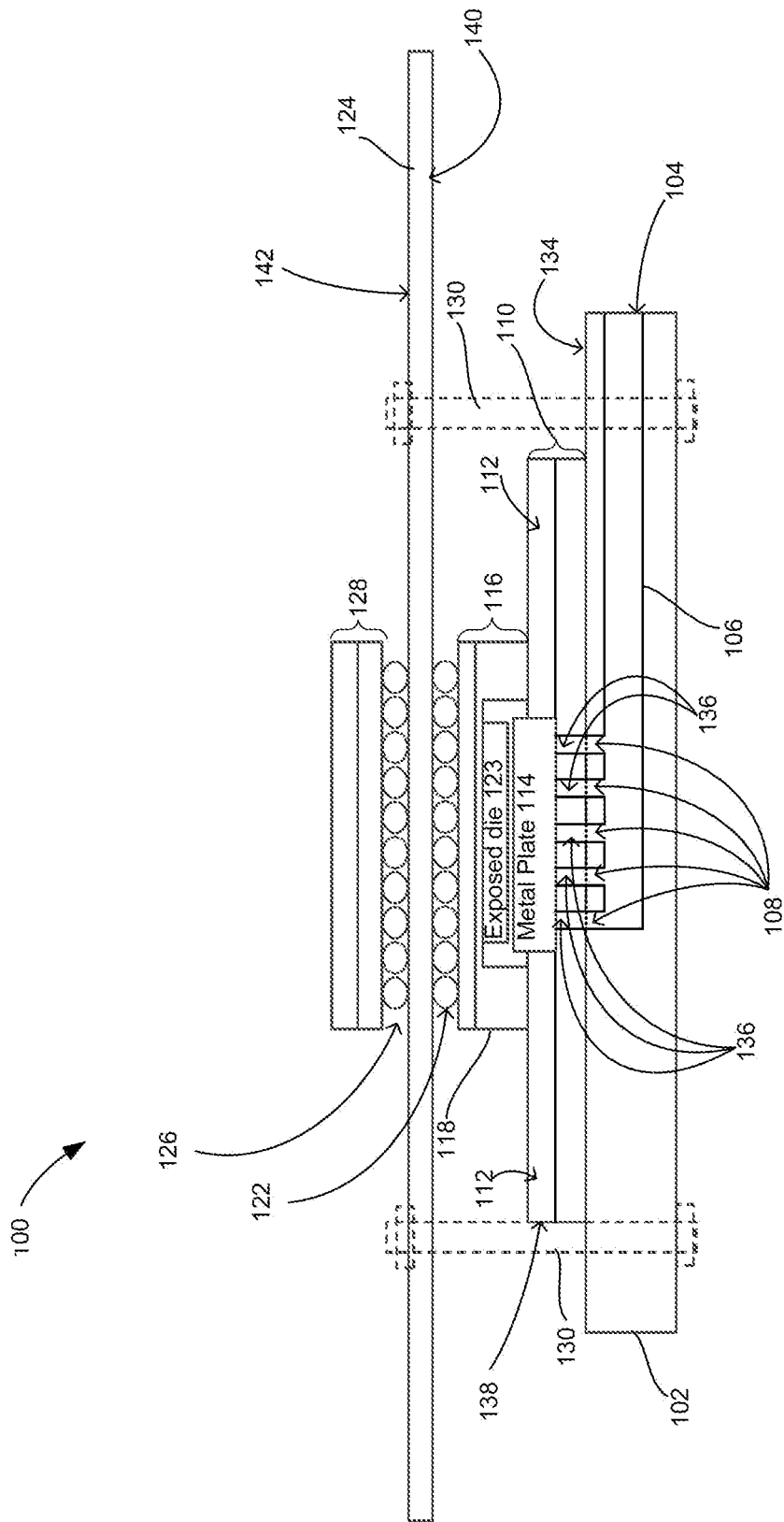
FIG. 1 is a cross-sectional view of a clamshell ball grid array ("BGA") structure according to aspects of the disclosure.

The technology relates generally to a system that provides a heatshield on the top side of a first ball grid array ("BGA")

package of a clamshell BGA structure to keep the solder joint temperature of the first BGA package below the reflow temperature and below the solidus temperature of the solder joint alloy such that the solder joints of the first BGA package do not become liquidus and/or soft enough to allow solder separation or other reflow-related solder defects during rework of a second BGA package. The clamshell BGA structure may include the first BGA package coupled to a first side of a printed circuit board ("PCB"). The second BGA package may be coupled to a second side of the PCB opposite the first side such that the first and second BGA packages make a clamshell around the PCB. A bottom side of the first BGA package may be coupled to the PCB. The bottom side of the first BGA package may be the side of the BGA package with the solder balls.

During manufacture of the clamshell BGA structure, rework of the second BGA package may be necessary. The heatshield on the top side of the first BGA package may prevent the solder coupling the first BGA package to the PCB from becoming liquidus during the rework of the second BGA package. This may prevent hot tears, separation, joint failure, defects, etc. of the solder joints of the first BGA package.

The heatshield may include a backer plate and a metal plate. According to some examples, the heatshield may additionally or alternatively include a package pedestal. The backer plate may include one or more air inlet ports connected to interior ducting as well as one or more vents. The air inlet ports are configured to be coupled to an air source, such as a compressor. The air source may cause a cooling gas, such as air or nitrogen, to flow through air inlet ducting within the backer plate and through the vents. The cooling gas may come in contact with the metal plate and/or additional components of the clamshell BGA, such as the first BGA package. As the cooling gas comes into contact with the metal plate and/or additional components of the clamshell BGA during rework of the second BGA package, the cooling gas may become heated. For example, thermal energy produced during the rework of the second BGA package may be transferred to the first BGA package, metal plate, and/or printed circuit board ("PCB"). The cooling gas reduces the thermal energy transferred to the first BGA package, metal plate, and/or PCB by cooling those components. By cooling those components, the solder of the first BGA package remains at a temperature that prevents the solder from becoming liquidus.

The cooling gas exits the system through one or more outlets in the backer plate, package pedestal, and/or metal plate. According to some examples, the metal plate and backer plate may form one or more outlets which allow the cooling gas to exit the system. The cooling gas may exit the system through fins of the metal place. In some examples, the backer plate may include one or more recesses, or outlets, extending from the center of the package pedestal to a perimeter edge of the package pedestal. The recesses may direct the heated cooling gas away from the heatshield.

According to some examples, there may be one or more exit vents, similar to the vents connected to the inlet ducting, that allow the now heated cooling gas to exit the system through air outlet ducting. The air outlet ducting may be connected to or extend from an air outlet port. According to some examples, the air outlet port may be coupled to a vacuum such that the heated gas may be removed from the system.

The metal plate may pull heat away from the first BGA package during the rework of the second BGA package. According to some examples, thermal energy produced by the rework of the second BGA package may be transferred to, or absorbed by, the metal plate. When thermal energy is transferred to the metal plate, the metal plate may increase in temperature. According to some examples, the metal plate may be made of a metal that has a high thermal conductivity. For example, the metal plate may be made of copper, aluminum, silver, gold, etc. A high thermal conductivity may allow the metal plate to absorb or receive more thermal energy produced during the rework of the second BGA package.

The metal plate may be coupled to a BGA or die. According to some examples, the backer plate may be coupled to a first side of the metal plate and the BGA may be coupled to a second side of the metal plate opposite the first side.

The metal plate may have one or more fins to maximize the surface area of the metal plate. According to some examples, increasing the surface area of the metal plate may increase the amount of contact the cooling gas has with the metal plate. By increasing the amount of contact between the metal plate and the cooling gas, the performance of the heatshield may increase as compared to a metal plate without fins. The performance of the heatshield may be how much heat is removed or dissipated by the heatshield.

According to some examples, as the cooling gas is injected or forced into the backer plate through the air inlet port, the cooling gas comes into contact with the metal plate as the cooling gas leaves the vents in the air inlet ducting. The cooling gas cools the metal plate that absorbed the heat from the rework of the second BGA package. As the cooling gas comes into contact with the metal plate, the now heated gas may exit through one or more fins in the metal plate and/or exit through the outlets in the backer plate. As the heated gas exits the system, the temperature of the first BGA package may remain below liquidus. This may prevent the solder joints of the first BGA package from melting during the rework of the second BGA package. The active cooling of the heatshield draws heat away from the first BGA package without inhibiting the rework process of the second BGA package.

FIG. 1 illustrates a cross section of a clamshell ball grid array ("BGA") structure. The clamshell BGA structure 100 may include two BGA packages 116, 128. According to some examples, the clamshell BGA structure 100 may further include a backer plate 102, a package pedestal 110, and a metal plate 114. The combination of the backer plate 102 and metal plate 114 may form a heatshield. According to some examples, the heatshield may additionally or alternatively include package pedestal 110.

The backer plate 102 may include one or more air inlet ports 104 connected to air inlet ducting 106. Air inlet ports 104 may be configured to be coupled to a gas source, such as a compressor. The compressor may force cooling gas into the air inlet ports 104. The cooling gas may be air or nitrogen. Air inlet ducting 106 may extend from air inlet ports 104. The air inlet ducting 106 may extend inward from an edge of the backer plate 102 where air inlet port 104. The air inlet ducts 106 may extend from the edge of the backer plate 102 towards the center of backer plate 102. According to some examples, air inlet ducting 106 may extend past the center of backer plate 102. The distance air inlet ducting 106 extends along and/or through a predetermined distance of backer plate 102. According to some examples, the determined distance may be determined based on the size and/or shape of metal plate 114. In some examples, the predetermined distance may be half, two-thirds, three-quarters, etc. of the length of the backer plate 102. However, those are merely some examples and are not intended to be limited. There may be one or more vents 108 extending from air inlet ducting 106 to a first surface 134 of backer plate 102. The air inlet ducting 106 and vents 108 may allow the cooling gas to travel through backer plate 102 towards metal plate 114.

The heatshield may include a package pedestal 110. The package pedestal 110 may be coupled to backer plate 102. According to some examples package pedestal 110 may be integral with backer plate 102. Package pedestal 110 may include one or more vents 136. The one or more vents 136 of package pedestal 110 may align with the one or more vents 108 of backer plate 102 when package pedestal 110 is coupled to backer plate 102. In examples where the package pedestal 110 is integral with backer plate 102, the one or more vents 136 of package pedestal 110 are a continuation of the one or more vents 108 of backer plate 102. The vents 136 of package pedestal 110 direct the cooling gas towards metal plate 114.

Package pedestal 110 may include one or more outlets 112 to allow heated gas to escape. The cooling gas from the compressor that is injected or forced into air inlet ports 104 may become heated gas once the cooling gas comes in contact with metal plate 114 during the rework process of the second BGA package 128. The heated gas may leave or dissipate from the heatshield by the one or more outlets 112. According to some examples, the one or more outlets 112 may be recesses or cutouts in package pedestal. The one or more outlets 112 may extend from metal plate 114 to edges 138 of package pedestal 110. For example, the one or more outlets 112 may be channels in package pedestal 110, as best seen in FIG. 2.

The metal plate 114 may be coupled to package pedestal 110. Alternatively, in examples where the package pedestal 110 is part of backer plate 102 or where there is no package pedestal 110, the metal plate 114 may be coupled to backer plate 102. The metal plate 114 may be coupled to the package pedestal 110 and/or backer plate 102 via one or more screws.

During the rework of the second BGA package 128, the metal plate 114 may pull heat away from the first BGA package 116. For example, the thermal energy produced during the rework of the second BGA package 128 may be absorbed by or transferred to the metal plate 114. As the metal plate 114 absorbs thermal energy and/or pulls heat away from the first BGA package 116, the metal plate 114, as part of the heatshield, may prevent reflow-related solder defects from occurring with respect to the first BGA package 116 during rework of the second BGA package 128.

The metal plate 114 may be made of a material with a high thermal conductivity. A high thermal conductivity may allow the metal plate 114 to absorb or receive a greater amount of thermal energy. For example, the metal plate 114 may be made of copper, aluminum, silver, gold, etc.

Figure 3:
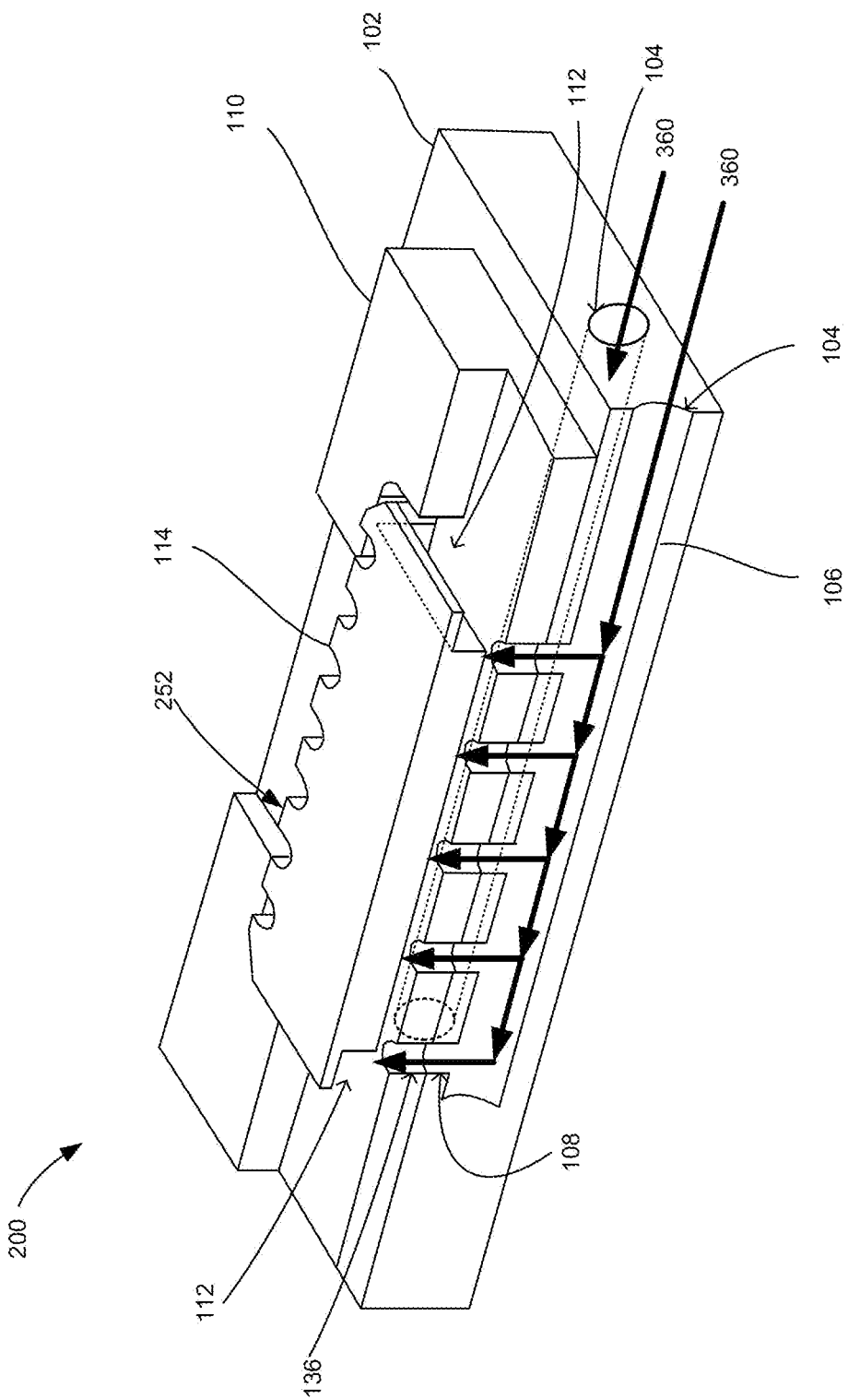
FIG. 3 is a cross-sectional perspective view of the heatshield of FIG. 2A according to aspects of the disclosure.

Metal plate 114 may be cooled by the cooling gas injected or forced into air inlet port 104. The metal plate 114 may have one or more fins 252, as shown in FIG. 3. The one or more fins 252 may increase the surface area of metal plate 114. Increasing the surface area of metal plate 114 may increase the amount of contact the cooling gas has with the metal plate 114 such that the performance of the heatshield increases as compared to a metal plate 114 without fins 252. The performance of the heatshield, which includes metal plate 114, may be how much heat, or thermal energy, is dissipated by the heatshield. According to some examples, the cooling gas may leave or dissipate from the heatshield by the one or more fins 252.

The first BGA package 116 may be located between the metal plate 114 and PCB 124. As shown, the first BGA package 116 may include a stiffener ring 118 and exposed die 123. The first BGA package 116 may be soldered to a first side 140 of PCB 124 via solder balls 122.

The second BGA package 128 may be coupled to a second side 142 of PCB 124 using solder balls 126. The second side 142 of PCB 124 may be opposite the first side 140 of PCB 124.

The heatshield, including the backer plate 102, metal plate 114, and/or package pedestal 110, may absorb the thermal energy during the rework of the second BGA package 128 to prevent the solder joints coupling the first BGA package 116 to PCB 124 from becoming liquidus and/or soft enough to allow reflow-related solder defects to occur. The solder joints coupling the first BGA package 116 to PCB 124 may include solder balls 122.

The PCB 124 may be connected, or coupled, to the backer plate 102 via one or more posts 130. Posts 130 may be screw-mounted to allow for easy removal after the rework process. According to some examples, using screw mounted posts 130 may leverage tooling holes in the PCB 124. The tooling holes may be the holes in PCB 124 that are used to attach the heatsink.

Figure 2A:
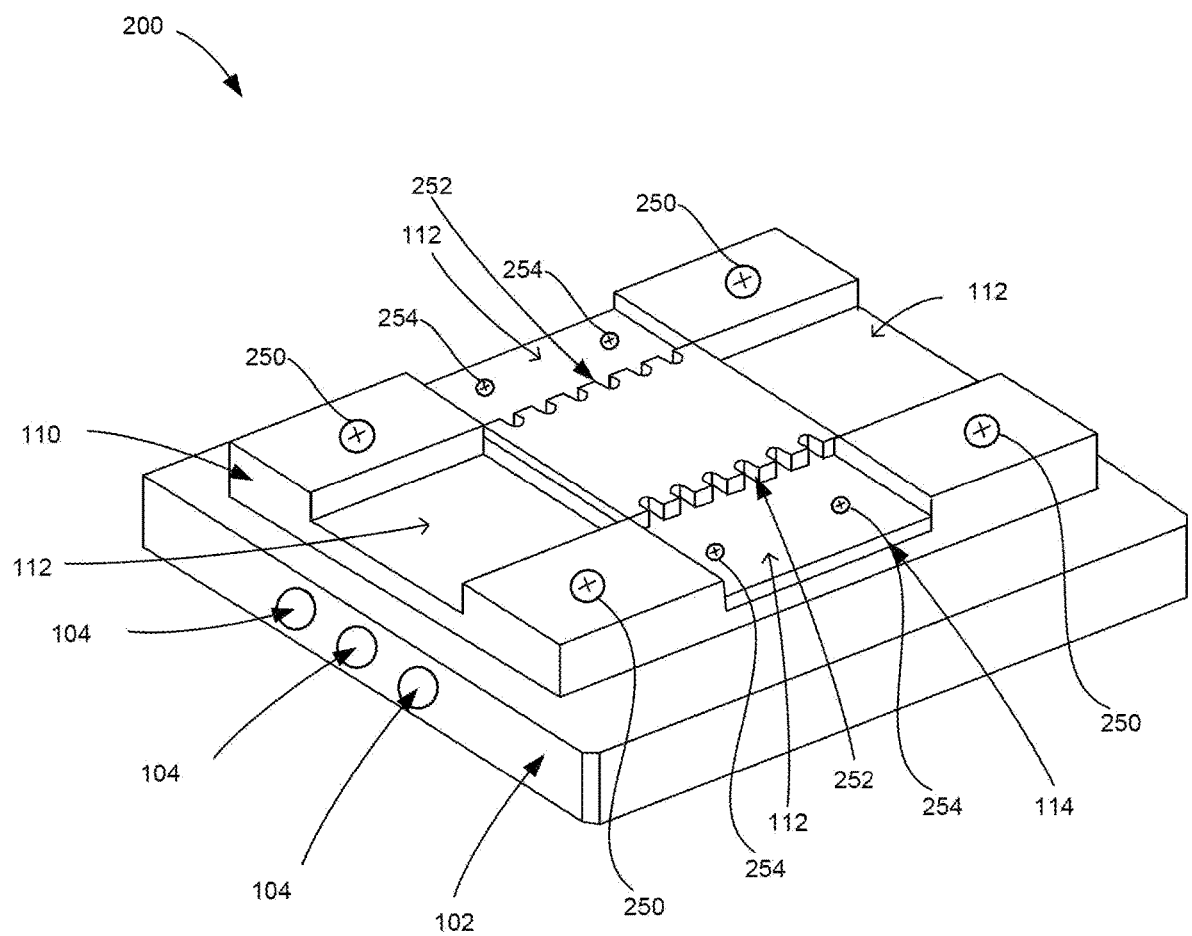
FIGS. 2A and 2B are perspective views of a portion of the heatshield according to aspects of the disclosure
Figure 2B:
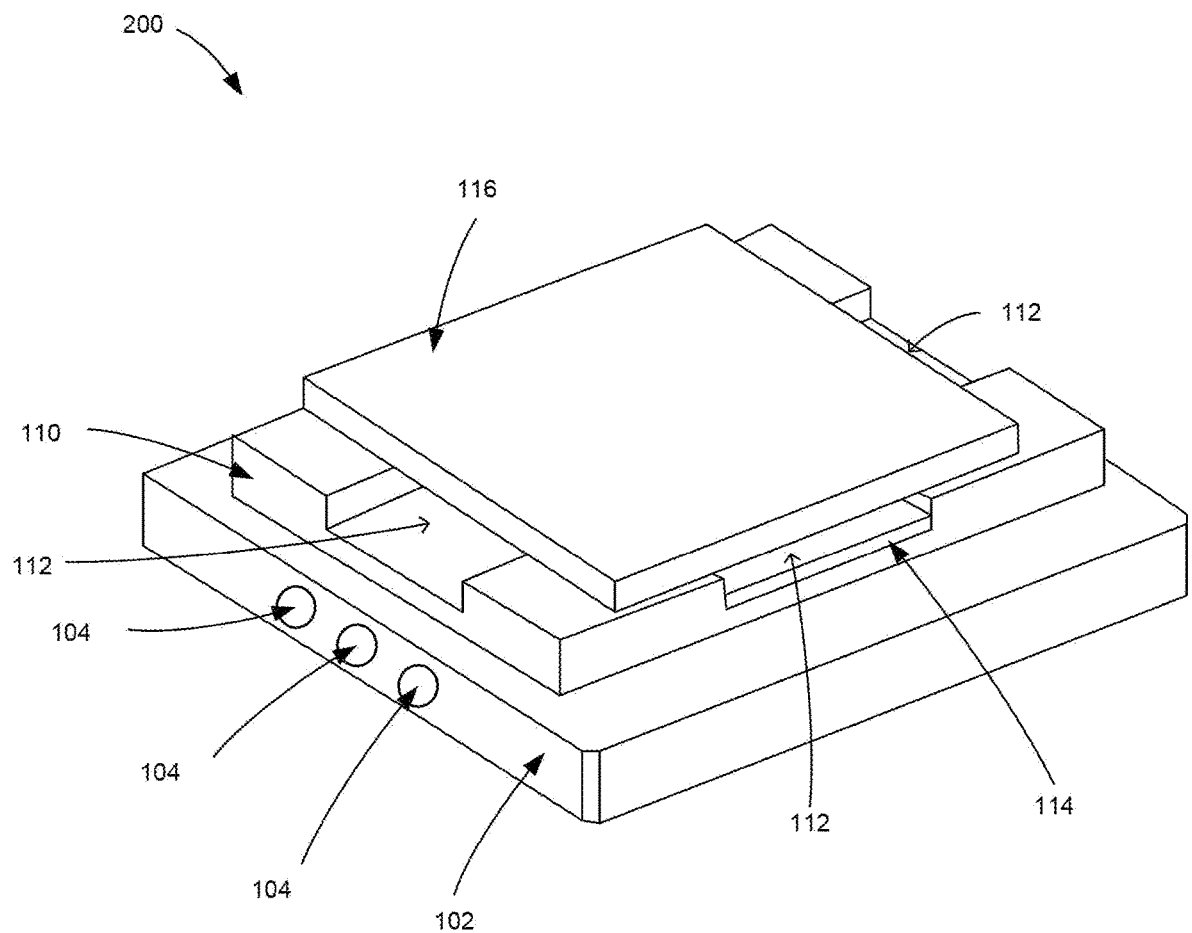

FIGS. 2A and 2B illustrate a perspective view of a heatshield 200. As shown, only some of the components of clamshell BGA structure 100 is shown in heatshield 200. For example, FIG. 2A illustrates a perspective view of the backer plate 102, the package pedestal 110, and the metal plate 114. FIG. 2B illustrates a perspective view of backer plate 102, the package pedestal 110, the metal plate 114, and the first BGA package 116.

Backer plate 102 includes one or more air inlet ports 104. While three air inlet ports 104 are shown, there may be any number of air inlet ports 104. According to some examples, there may be one, four, five, etc. air inlet ports. Thus, the example of three air inlet ports 104 is only one example and is not intended to be limiting.

The thickness of the backer plate 102 may in some examples be relational to the diameter of the air inlet ports 104. For example, the thickness of the backer plate must be larger than the diameter of the air inlet ports 104. If the diameter of the air inlet ports 104 is reduced, the thickness of the backer plate 102 may be reduced also.

The package pedestal 110 may extend from the first surface 134 of backer plate 102. According to some examples, the package pedestal 110 may be integral with backer plate 102. In some examples, package pedestal 110 may be a separate component that is coupled to backer plate 102. As shown, package pedestal 110 is coupled to backer plate 102 via a plurality of screws 250.

The package pedestal 110 may include one or more outlets 112. The outlets 112 may extend, or radiate, outward from the center of package pedestal 110. According to some examples, outlets 112 may be a cut out or recess in package pedestal 110. While shown as rectangular recesses within package pedestal 110, outlets 112 may have any shape or size, such as semi-circular. According to some examples, there may be an outlet 112 that extends outward to each edge, or side, of the package pedestal. In the example shown in FIG. 2, there are four outlets 112. However, this is merely one example and is not intended to be limiting, and in other examples any number of outlets may be included. In some examples, the outlets 112 may extend non-linearly. According to some examples, the outlets 112 may form a star burst such that outlets 112 extend from the center of package pedestal 110 outwardly in all directions.

The metal plate 114 may be coupled to package pedestal 110 between the package pedestal 110 and first BGA package 116. Metal plate 114 may be coupled to package pedestal 110 via one or more screws 254. As shown, at least a portion of metal plate 114 may extend into outlets 112.

The metal plate 114 may include a plurality of fins 252. The plurality of fins 252 may increase the surface area of metal plate 114. Increasing the surface area of metal plate 114 may increase the amount of contact the cooling gas has with the metal plate. The greater the amount of cooling gas that comes in contact with metal plate 114, the better the heatshield may perform as compared to a metal plate 114 without fins. The heatshield may be the combination of the metal plate 114 and backer plate 102.

As cooling gas is forced into heatshield 200 the cooling gas may become heated once it comes in contact with metal plate 114 and/or first BGA package 116. The outlets 112 may direct the heated gas away from metal plate 114, first BGA package, and/or heatshield 200. The heated gas may also escape heatshield 200 by traveling through fins 252 and outlets 112.

As shown in FIG. 2B, the first BGA package 116 may be layered on top of package pedestal 110 and/or metal plate 114. As described with respect to FIG. 1, the first BGA package 116 may include a stiffener ring and/or an exposed die. Both the stiffener ring and/or exposed die may be on the side of the first BGA package 116 closest to the package pedestal 110 and metal plate 114 and, therefore, are not shown in FIG. 2B. According to some examples, a thermal interface material may be used between the exposed die of the first BGA package 116 and the metal plate 114 of the heatshield to reduce thermal resistance. The thermal interface material may be, for example, a thermal pad or grease. In some examples, a foam pad may be used to provide mechanical protection for the die to prevent cracking, etc. Additionally or alternatively, there may be a small air gap between the exposed die of the first BGA package 116 and the metal plate 114.

FIG. 3 illustrates a cross-sectional perspective view of the portion of the heatshield shown in FIG. 2A as cooling gas is forced into heatshield 200. Air inlet ducting 106 extends from air inlet port 104. A plurality of vents 108 may extend from air inlet ducting 106 to the first surface 134 of backer plate 102. For clarity purposes, only one vent 108 of the plurality of vents 108 is labeled in FIG. 3. The air inlet ducting 106 and vents 108 may direct the cooling gas 360 that is injected, or forced, into the heatshield 200 towards the metal plate 114.

Package pedestal 110 may include a plurality of vents 136. For clarity purposes, only one vent 136 of the plurality of vents 136 is labeled in FIG. 3. When package pedestal 110 is coupled to backer plate 102, the plurality of vents 136 in package pedestal 110 may align with the plurality of vents 108 in backer plate 102. The vents 108, 136 may direct the cooling gas 360 towards the bottom of metal plate 114.

For example, during manufacture of the clamshell BGA structure 100, rework of the second BGA package 128 may be necessary. The heat, or thermal energy, produced during the rework of the second BGA package 128 may cause the solder joints of the first BGA package 116 to become liquidus and/or soft enough to allow reflow-related solder defects to occur. To prevent the solder joints of the first BGA package from becoming liquidus, cooling gas 360 may be forced into the heatshield to cool the metal plate 114, during the rework process of the second BGA package 128. The cooling gas 360 may cool the metal plate 114 such that the solder joint temperature of the first BGA package 116 is kept below the reflow temperature and below the solidus temperature of the solder joint alloy. This may prevent hot tears, separation, joint failure, reflow-related defects, etc. of the solder joints of the first BGA package.

The cooling gas 360 may be forced into heatshield 200 via an air compressor. The cooling gas 360 may be air or nitrogen gas.

Figure 4:
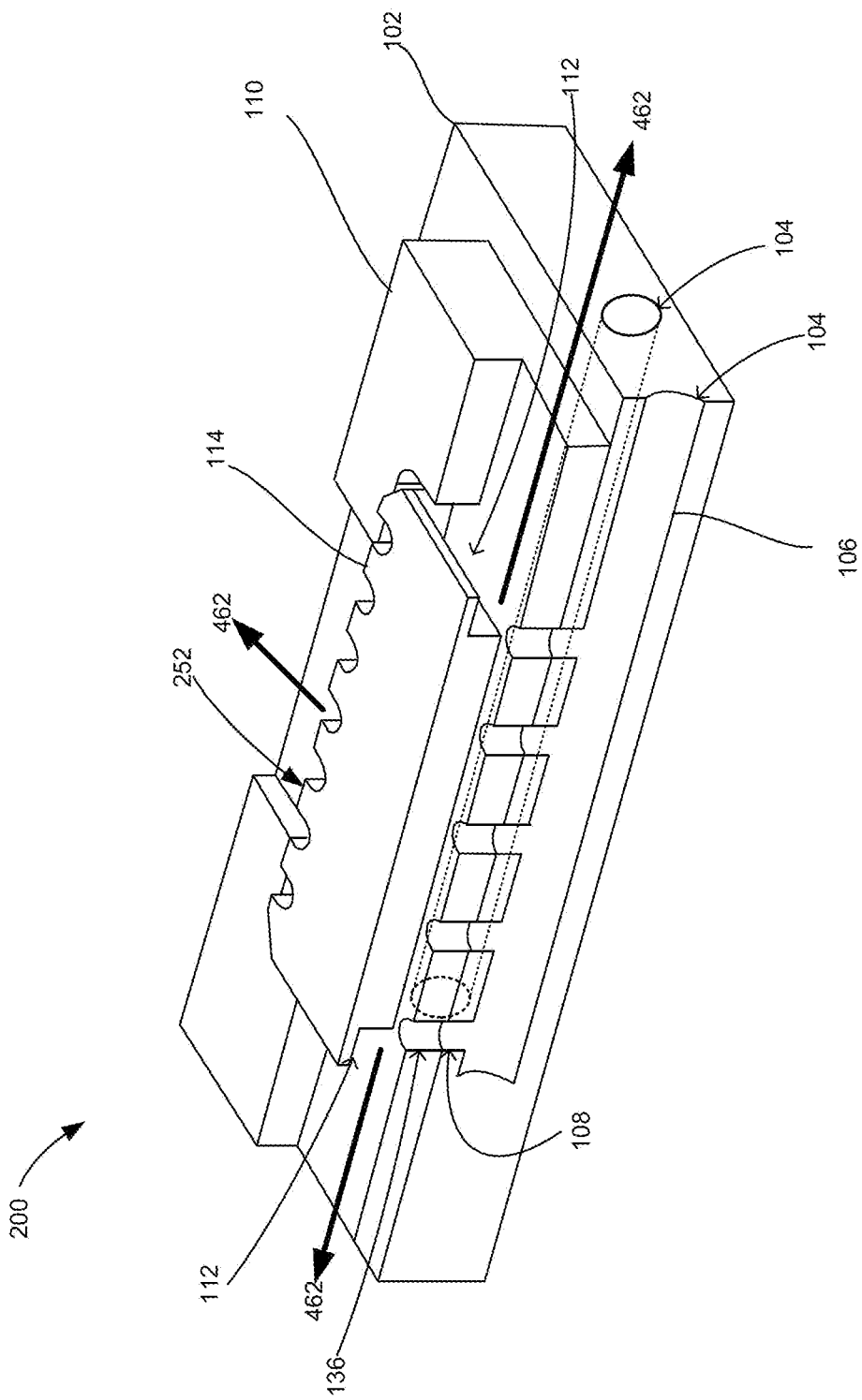
FIG. 4 is a cross-sectional perspective view of cooling gas being forced into the heatshield of FIG. 2A according to aspects of the disclosure.

FIG. 4 illustrates a cross-sectional perspective view of the portion of the heatshield shown in FIG. 2A as heated gas leaves the heatshield 200. As described with respect to FIG. 3, cooling gas 360 may be forced into heatshield 200 during the rework of the second BGA package 128. As the cooling gas 360 comes in contact with the metal plate 114 and/or the first BGA package 116, the cooling gas 360 may be heated. The heated gas 462 exits the heatshield 200 via one or more outlets 112. For example, as the cooling gas 360 comes in contact with the metal plate 114, the heated gas 462 may leave through fins 252 of metal plate 114. According to some examples, the fins 252 of metal plate 114 may be located in outlet 112. Therefore, outlet 112 may direct the heated gas 462 away from heatshield 200.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A system, comprising:
a backer plate including at least one air inlet port;
a metal plate coupled to the backer plate; and
a package pedestal coupled to the backer plate,
wherein the metal plate and the backer plate form one or more outlets extending along a surface of the package pedestal,
wherein the one or more outlets include a recess in the package pedestal, the recess extending outward to a perimeter edge of the package pedestal,
wherein the at least one air inlet port is configured to receive gas, and
wherein the gas is configured to exit the system through at least one of the one or more outlets.

2. The system of claim 1, wherein the backer plate further includes air inlet ducting connected to the at least one air inlet port and a first plurality of vents extending from the air inlet ducting to a first surface of the backer plate.

3. The system of claim 1, further comprising:
a printed circuit board ("PCB"); and
a first ball grid array ("BGA") package positioned between the metal plate and the PCB, wherein the first BGA package is coupled to a bottom surface of the PCB.

4. The system of claim 3, further comprising a second BGA package soldered to a top surface of the PCB.

5. The system of claim 4, wherein at least one of the backer plate or the metal plate is configured to absorb heat from the first BGA package during rework of the second BGA package.

6. The system of claim 1, wherein the metal plate is a finned metal plate.

7. The system of claim 6, wherein the gas is configured to exit the system through at least one fin of the finned metal plate.

8. The system of claim 1, further comprising a removable heatshield for cooling a clamshell ball grid array ("BGA") structure during rework of a first or second BGA package of the clamshell BGA structure, the removable heatshield comprising the backer plate, the metal plate, and the package pedestal.

9. The system of claim 1, wherein the package pedestal is positioned between the backer plate and the metal plate.

10. The system of claim 1, wherein the surface is a top surface of the package pedestal.

11. The system of claim 1, wherein
the backer plate further includes air inlet ducting connected to the at least one air inlet port, and a first plurality of vents extending from the air inlet ducting to a first surface of the backer plate,
the package pedestal includes a second plurality of vents extending from a bottom surface of the package pedestal to a top surface of the package pedestal, and
the second plurality of vents align with the first plurality of vents when the package pedestal is coupled to the backer plate.

12. A heatshield, comprising:
a backer plate including at least one air inlet port and air inlet duct connected to the at least one air inlet port;
a package pedestal coupled to the backer plate; and
a metal plate coupled to the package pedestal,
wherein the at least one air inlet port and the air inlet duct are configured to receive cooling gas to decrease a temperature of the metal plate, and
wherein the package pedestal includes one or more recesses extending outwardly from a center of the package pedestal to a perimeter edge of the package pedestal.

13. The heatshield of claim 12, wherein a plurality of vents extend from the air inlet duct through the package pedestal.

14. The heatshield of claim 12, wherein the heatshield is a removable heatshield for cooling a clamshell ball grid array ("BGA") structure during rework of a first or second BGA package of the clamshell BGA structure.

15. The heatshield of claim 13, wherein the at least one air inlet port, the air inlet duct, and the plurality of vents are configured to direct the cooling gas through the heatshield.

16. The heatshield of claim 12, wherein the plurality of vents are configured to direct the cooling gas towards the metal plate.

17. The heatshield of claim 13, wherein the cooling gas is configured to exit the heatshield through at least one of the one or more recesses.

18. The heatshield of claim 12, wherein the metal plate is a finned metal plate.

19. The heatshield of claim 18, wherein the cooling gas is configured to exit the heatshield through at least one fin of the finned metal plate.

20. A system, comprising:
a backer plate including at least one air inlet port air inlet ducting connected to the at least one air inlet port, and a first plurality of vents extending from the air inlet ducting to a first surface of the backer plate;
a metal plate coupled to the backer plate; and
a package pedestal coupled to the backer plate, wherein the package pedestal includes a second plurality of vents extending through the package pedestal,
wherein the second plurality of vents align with the first plurality of vents when the package pedestal is coupled to the backer plate,
wherein the metal plate and the backer plate form one or more outlets,
wherein the at least one air inlet port is configured to receive gas, and
wherein the gas is configured to exit the system through at least one of the one or more outlets.

* * * * *